(12) United States Patent
Kim

(10) Patent No.: US 7,335,520 B2
(45) Date of Patent: Feb. 26, 2008

(54) METHOD AND APPARATUS FOR FABRICATING FLAT PANEL DISPLAY

(75) Inventor: Jin Wuk Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 326 days.

(21) Appl. No.: 11/154,649

(22) Filed: Jun. 17, 2005

(65) Prior Publication Data
US 2006/0105487 A1 May 18, 2006

(30) Foreign Application Priority Data
Nov. 12, 2004 (KR) ................ 10-2004-0092684

(51) Int. Cl.
*H01L 21/02* (2006.01)
(52) U.S. Cl. ............... 438/22; 257/E33.001; 438/35; 977/887
(58) Field of Classification Search .......... 438/22, 438/35; 977/887; 257/E33.001
See application file for complete search history.

(56) References Cited
U.S. PATENT DOCUMENTS

| 6,812,990 B1 | 11/2004 | Hofmann et al. |
| 7,128,559 B1 * | 10/2006 | Cardinale et al. ........... 425/385 |
| 2007/0110962 A1 * | 5/2007 | Tien et al. .................. 428/156 |

FOREIGN PATENT DOCUMENTS

| KR | 2003-0092314 | 12/2003 |
| KR | 2004-0079566 | 9/2004 |
| WO | WO-2004-062870 | 7/2004 |
| WO | WO-2004/097884 | 11/2004 |

OTHER PUBLICATIONS

Xia et al., Soft Lithography, Angew. Chem. Int. Ed. 1998, 37, pp. 550-575.*
Ito, Chemical Amplification Resists: Inception, Implementationin Device Manufacture, and New Developments, J. Polym. Sci. Part A: Polym. Chem.: vol. 41 (2003).*

* cited by examiner

*Primary Examiner*—Matthew C. Landau
*Assistant Examiner*—Minchul Yang
(74) *Attorney, Agent, or Firm*—Morgan, Lewis & Bockius LLP

(57) ABSTRACT

A fabricating method of a flat panel display includes the steps of spreading an etch-resist on a thin film formed on a substrate, a polarity of the etch-resist changed by irradiation with a first light; providing a soft mold having a projected surface and a groove at an upper surface of the etch-resist at a distance from the substrate, the soft mold surface treated to be the same polarity as the etch-resist; performing a first and a second alignments of the soft mold and substrate; changing the polarity of the etch-resist by irradiation with the first light such that the etch-resist moves into a groove of the soft mold; forming an etch-resist pattern by irradiating a second light onto the etch-resist in the groove; separating the soft mold from the etch-resist pattern; and forming a thin film pattern by etching a portion of the thin film and the etch-resist pattern.

11 Claims, 9 Drawing Sheets

METHOD AND APPARATUS FOR FABRICATING FLAT PANEL DISPLAY

This application claims the benefit of the Korean Patent Application No. P2004-92684 filed on Nov. 12, 2004, which is hereby incorporated by reference.

BACKGROUND OF THE INVENTION

1. Field of the Invention

The present invention relates to a flat panel display, and more particularly, to a method and apparatus used to fabricate a flat panel display that simplifies a fabricating process by decreasing a number of patterning process and improving accuracy while aligning a thin film pattern.

2. Discussion of the Related Art

In a recent information society, display devices, specifically flat type display devices, have gained in importance as a visual information communication medium. Fflat panel display devices include liquid crystal display (LCD) devices, field emission display (FED) devices, plasma display panel (PDP) devices and an electroluminescence (EL) displays. Most of these display devices are already available on the market. On the other hand, related art cathode ray tube or braun tube is decreasing its popularity due to bulky size and heavier weight.

One of the flat panel display devices, the liquid crystal display device, is considered to generally satisfy users' needs. Specifically, light weight, thin width, low power consumption, small size, and other advantages of the liquid crystal display device attract many users. In addition, manufactures are able to mass produce liquid crystal display devices. Accordingly, related art cathode ray tubes are being actively replaced by the liquid crystal display device.

As shown in FIG. 1, a related art active matrix type liquid crystal display device, which drives a liquid crystal cell by a thin film transistor (hereinafter, referred to as "TFT"), has an advantage such as a high quality picture and low power consumption. The related art active matrix type liquid crystal display device is rapidly developed into a larger-size having a higher-resolution through an active research and development. The related art active matrix type liquid crystal display device of FIG. 1 has a color filter substrate 22 and a TFT array substrate 23 bonded together with a liquid crystal layer 15 interposed therebetween.

In the color filter substrate 22, a color filter 13 and a common electrode 14 are formed on the rear surface of an upper glass substrate 12. A polarizer 11 is adhered onto the front surface of the upper glass substrate 12. The color filter 13 has red R, green G and blue B color filter layers arranged therein to transmit a light of a specific wavelength range, thereby enabling the display device to display color. A black matrix (not shown) is formed between the adjacent color filters 13. In the TFT array substrate 23, data lines 19 and gate lines 18 cross each other on the upper surface of a lower glass substrate 16, and a TFT 20 is formed at an intersection thereof. A pixel electrode 21 is formed at a cell area between the data line 19 and the gate line 18 on the upper surface of the lower glass substrate 16. The TFT 20 switches a data transmission path between the data line 19 and the pixel electrode 21 in response to a scan signal from the gate line 18, thereby driving the pixel electrode 21. The polarizer 17 is adhered to the rear surface of the TFT array substrate 23.

A liquid crystal layer 15 controls the amount of light transmitted through the TFT array substrate by applied electric field. The polarizers 11 and 17 adhered to the color filter substrate 22 and the TFT substrate 23 transmit a polarized light in any direction, and when the liquid crystal 15 is in a 90° TN mode, their polarizing directions cross each other perpendicularly. An alignment film (not shown) is formed on the liquid crystals at an opposite surfaces to the color filter substrate 22 and the array TFT substrate 23.

A related art fabricating method of the active matrix type liquid crystal display device is divided into a substrate cleaning process, a substrate patterning process, an alignment film forming/rubbing process, a substrate bonding/liquid crystal injecting process, a mounting process, an inspection process, a repair process and other suitable processes. The substrate cleaning process removes impurities (i.e., contaminates a substrate surface of the liquid crystal display device) with a cleaning solution. The substrate patterning process is performed by patterning process of the color filter substrate and a patterning process of the TFT array substrate. The alignment film forming/rubbing process spreads an alignment film over each of the color filter substrate and the TFT array substrate, and rubs the alignment film with a rubbing cloth. The substrate bonding/liquid crystal injecting process bonds the color filter substrate with the TFT array substrate by a sealant and injects liquid crystal and spacers through a liquid crystal injection hole, and then seals up the liquid crystal injection hole. The mounting process connects a tape carrier package (hereinafter, referred to as "TCP") to a pad part of the substrate, wherein the TCP has an integrated circuit IC such as a gate drive IC and a data drive IC mounted thereon. The drive IC can be directly mounted on the substrate by a chip-on-glass (hereinafter, referred to as "COG") method or a tape automated bonding (TAB) method. The inspection process includes an electrical inspection which is performed after forming the pixel electrode and the signal lines (i.e., data line and gate lines in the TFT array substrate). An electrical inspection and a macrography are performed after the substrate bonding/liquid crystal injecting process. When the substrate is judged repairable in the inspection process, then the repair process performs a restoration of the substrate. Otherwise, the substrate are disposed as waste.

A thin film material deposited on the substrate is patterned by a photolithography process. The photolithography process is a series of photography process which includes photo-resist spreading, mask aligning, exposure, development and cleaning. However, the photolithography process has several problems, for example, the time required to complete the photolithography process is long, a photo-resist material and a strip solution are greatly wasted, and expensive equipments like an exposure equipment is required.

SUMMARY OF THE INVENTION

Accordingly, the present invention is directed to a method and apparatus for fabricating flat panel display that substantially obviates one or more of the problems due to limitations and disadvantages of the related art.

An object of the present invention is to provide a method and apparatus for fabricating a flat panel display that simplifies a fabricating process.

Another object of the present invention is to provide a method and apparatus for fabricating method for a flat panel display that improves alignment accuracy when a thin film patter is formed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method and apparatus for fabricating flat panel display includes a fabricating method of spreading an etch-resist on a thin film formed on a substrate, a polarity of the etch-resist being changed by irradiation with a first light; providing a soft mold having a projected surface and a groove at an upper surface side of the etch-resist at a designated distance from the substrate, the soft mold being surface treated to be the same polarity as the etch-resist; performing a first alignment of the soft mold and the substrate; performing a second alignment of the soft mold and the substrate; changing the polarity of the etch-resist by irradiation with the first light such that the etch-resist moves into a groove of the soft mold; forming an etch-resist pattern on the thin film by irradiating a second light onto the etch-resist in the groove; separating the soft mold from the etch-resist pattern; and forming a thin film pattern by etching a portion of the thin film and the etch-resist pattern.

In another aspects, a fabricating apparatus of a flat panel display includes means for spreading an etch-resist on a thin film on a substrate; means for performing irradiation of a first light to the etch-resist such that a polarity of the etch-resist changes; a soft mold having a projected surface and a groove, the soft mold facing an upper surface of the etch-resist, wherein a surface of the soft mold is treated to be the same polarity as the etch-resist; means for performing a first alignment of the soft mold and the substrate, wherein the soft mold and the substrate are separated with a designated distance therebetween; means for performing a second alignment of the soft mold and the substrate after placing the soft mold on the etch-resist; means for irradiating a second light to the etch-resist; means for separating the soft mold from the etch-resist pattern; and means for forming a thin film pattern by etching a portion of the thin film, wherein the etch-resist pattern is used as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
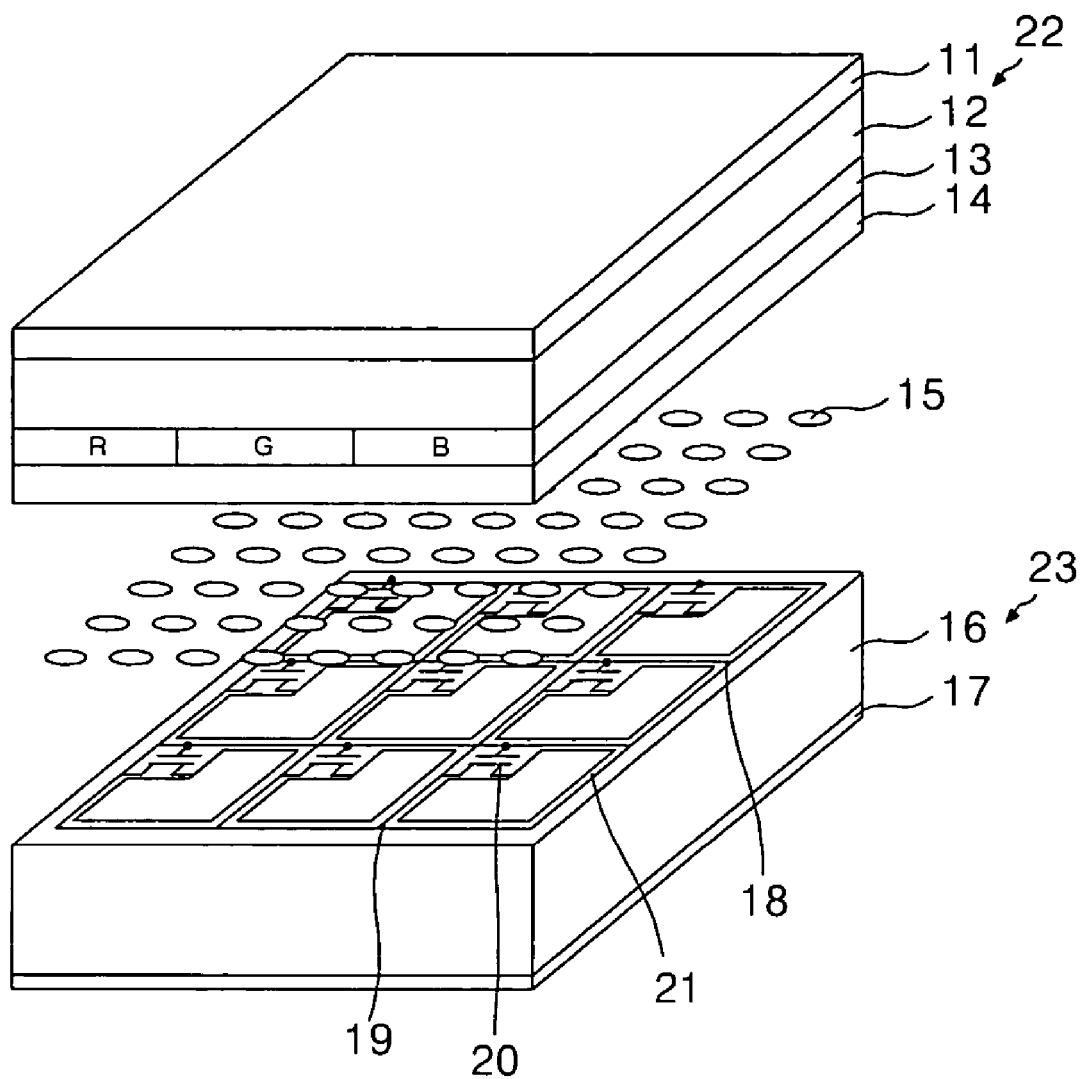
FIG. 1 illustrates a related art active matrix type liquid crystal display device.
Figure 2:
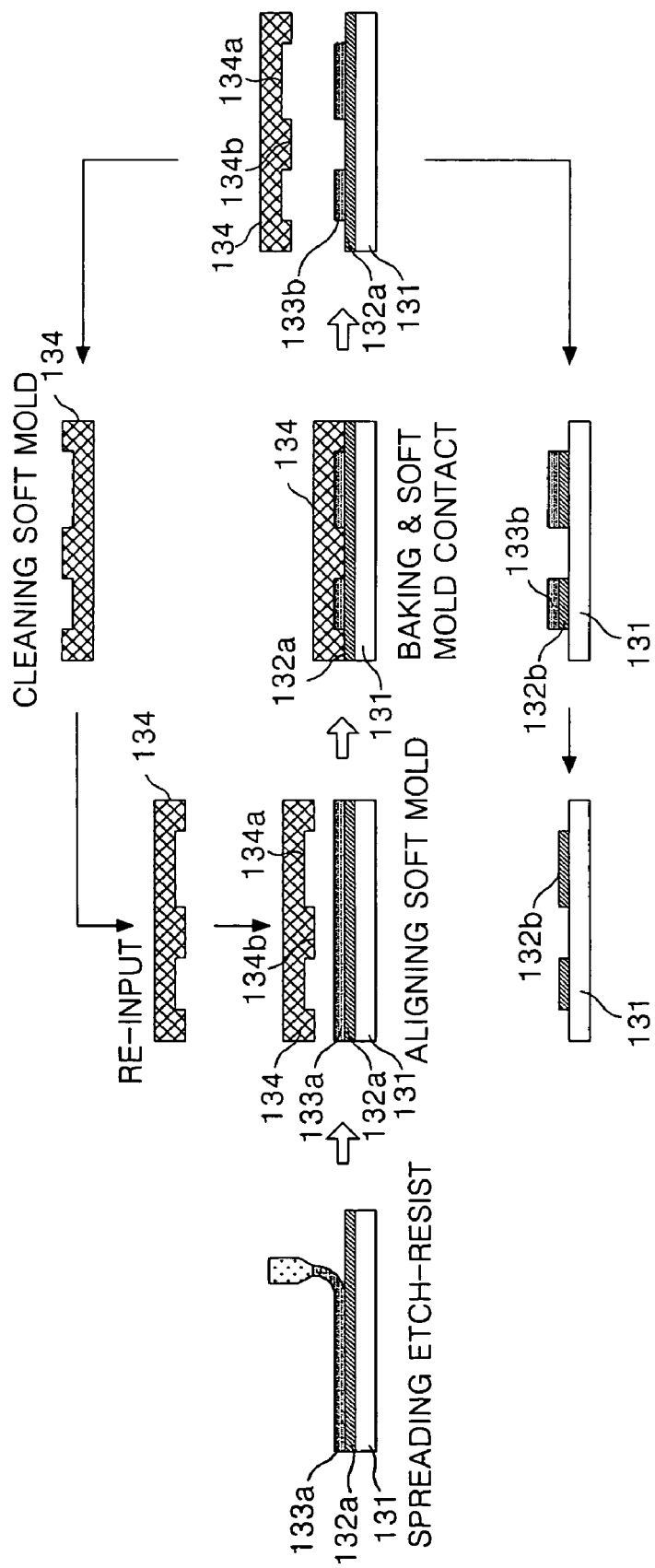
FIG. 2 illustrates a fabrication method of a flat panel display according to an exemplary embodiment of the present invention.
Figure 3:
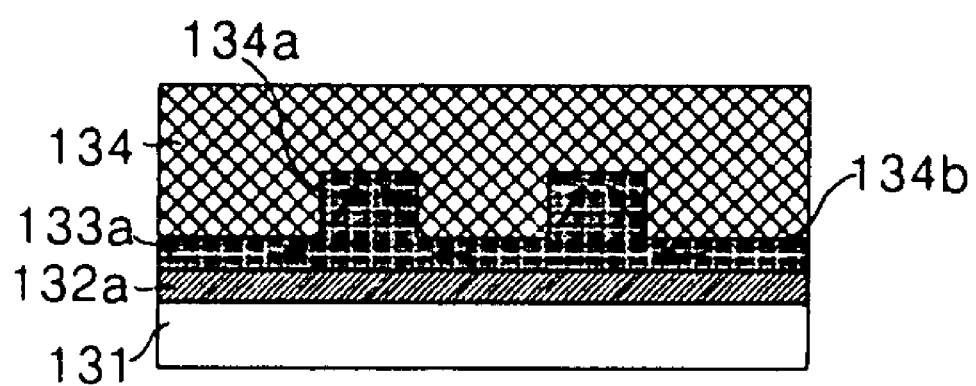
FIG. 3 illustrates a related art etch-resist solution and a soft mold when the etch-resist moves into the groove of soft mold by a capillary force.

Reference will now be made in detail to the preferred embodiments of the present invention, examples of which are illustrated in the accompanying drawings. Hereinafter, the exemplary embodiment of the present invention will be explained with reference to FIGS. 2 to 5. FIG. 2 illustrates diagrams briefly illustrating a fabricating method of a flat panel display according to the present invention. FIG. 3 illustrates a related art fabricating method of the flat panel display. FIGS. 4A to 4E are diagrams illustrating a fabricating process when a thin film is formed by a soft mold and an etch-resist.

Referring to FIG. 2, the fabricating method of the flat panel display according to the exemplary embodiment of the present invention includes a spreading process to spread an etch-resist solution 133a on a substrate 131 where a thin film 132a is formed; a patterning process to pattern an etch-resist layer 133 by a soft mold 134; an etching process to pattern the thin film 132; a stripping process to remove the remaining etch-resist pattern; and an inspection process. The thin film 132a is formed on the substrate 131 by a spreading process or a deposition process The thin film 132a is formed of a basic material which is used in a metal pattern, an organic pattern and an inorganic pattern that remain in the array of the flat panel display.

The etch-resist solution 133a includes a main resin having a designated polarity that includes at least one of liquid high polymer precursor or liquid monomer. In addition, the etch-resist solution 133a includes an activator, an initiator and a thermal flow derivative. The etch-resist solution 133a of the exemplary embodiment of the present invention changes its polarity from a hydrophobic property to a hydrophilic property by irradiation of a designated light. A composition of the etch-resist solution 133a is listed in TABLE 1.

TABLE 1

| | Composition | | | |
|---|---|---|---|---|
| | Main Resin | Activator | Initiator | Derivative |
| Compositon amount | 30-50% | 0.01-3% | 0.01-3% | 30-50% |

The main resin performs as an etch-resist, and exists in monomer or oligomer type liquid in its initial state and changes to high polymer. In this exemplary embodiment, the main resin may include the liquid high polymer precursor or the liquid monomer, such as, tBOC-p-S (para-tert-butosy-carbonyloxystyrene).

An activator changes the polarity of the whole etch-resist solution by changing the polarity of the main resin. When the property should be changed from hydrophobic to hydrophilic, the activator helps to form —OH radical of the main resin. Then, the —OH radical reacts to energy, however leaving an initiator unaffected. The suitable material for the activator is an onium salts group material (i.e., a triphenyl-sulfonium salts material) which reacts with ultraviolet rays of about 250 nm in wavelength.

The initiator changes the state of material from a liquid state to a solid state after the polarity of the main resin is changed from hydrophobic to hydrophilic by the activator. The suitable material for the initiator is a material which is unaffected when the activator generates reactions at wavelength around 365 nm. For example, 1-hydroxy-cyclohexylphenyl-ketone and other suitable material may be used as the initiator. The derivative increases the adhesive property between the etch-resist and the substrate after completing the spreading process.

The etch-resist solution 133a including the above-described materials is spread on the thin film 132a by a spreading process (i.e., nozzle spray, spin coating and other suitable spreading process). The soft mold 134 is made of a rubber material which has high elasticity (i.e., polydimethylsiloxane PDMS, polyurethane, cross-linked novolac resin and other suitable material). A groove 134a is formed on the soft mold 134 at the portion corresponding to a etch-resist pattern remained on the substrate 131. The soft mold 134 having the groove 134a and a projected surface 134b is proposed in the Korean patent application No. 2003-0098122. The surface of the soft mold is processed to be hydrophobic or hydrophilic by the same method proposed in the Korean patent application No. 2003-0098122. Hereinafter, it is assumed that the soft mold 134 is hydrophobic for explaining the embodiments of the Korean patent application No. 2003-0098122. The soft mold 134 is aligned on the etch-resist solution 133a. Thereafter, a pressure, a weight of the soft mold 134, is applied to the mold 134, so that the mold 134 is contacting the thin film 132a.

As shown in FIG. 3, the Korean patent application No. 2003-0098122 teaches that the etch-resist solution 133a moves into the groove 134a of the soft mold 134 by a capillary force. The capillary force is generated by a pressure between the soft mold 134 and the glass substrate 131 and a repulsive force between the soft mold 134 and the etch-resist solution 132a. As a result, the etch-resist pattern 133b is formed on the thin film 132a. After the soft mold 134 is separated from the substrate 131, a wet etching process or a dry etching process is performed. At this moment, the etch-resist pattern 133b functions as a mask, thus only the thin film 132a located at the lower part of the etch-resist pattern 133b remains on the substrate 131 and the rest of the thin film 132a is removed. Subsequently, the etch-resist pattern 133b is removed by the stripping process, then the short circuit or broken wire of the thin film pattern 132b are inspected through an electrical and optical inspection.

After the soft mold 134 is separated from the substrate 131, the soft mold 134 is cleaned by UV ray and ozone $O_3$, then the soft mold 134 is re-used to pattern another thin film 132a. In a related art fabricating method of Korean patent application No. 2003-0098122, masks are aligned on the substrate 131 having a designated distance from the substrate 131 to perfect the proper alignment in the photo process. When the soft mold 134 is aligned having a designated distance from the substrate 131, and if the different designated distance is used as compared to the one used in the masks of the photo process, the soft mold 134 bents by its own weight to make contact with the substrate 131. Accordingly, it is erroneous such that the shape of the thin film may not formed accurately by the soft mold and the etch-resist of the related art.

Figure 4A:
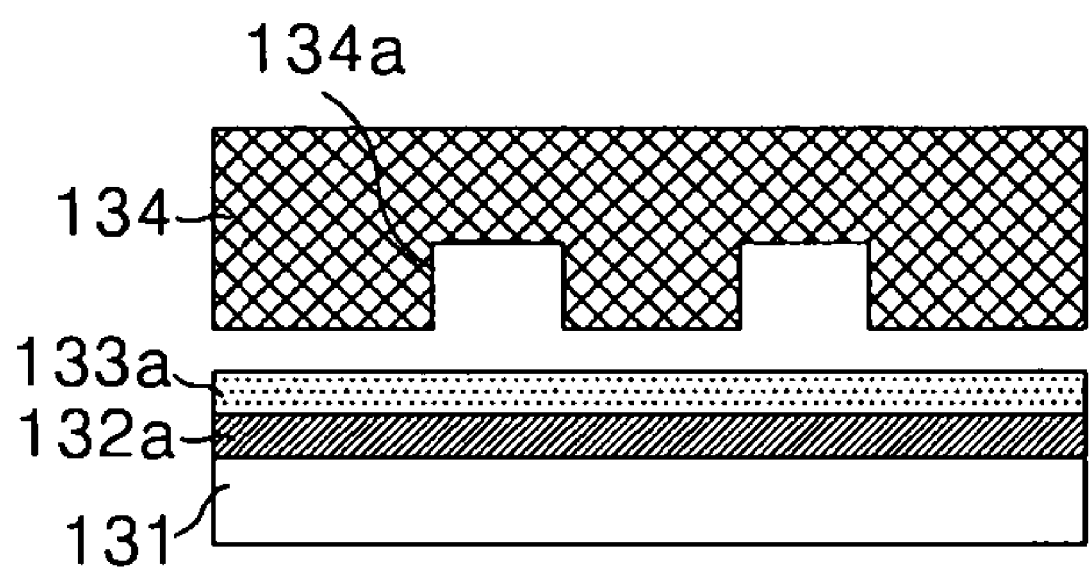
FIGS. 4A to 4E illustrate a method of forming a thin film by the etch-resist in accordance with an exemplary embodiment of the present invention.

In reference to FIGS. 4A to 4E, a process to form the thin film pattern 132b at the desired position by the etch-resist solution 133a and the soft mold 134 will be described. As shown in FIG. 4A, the soft mold 134 is aligned first with the designated distance from the substrate 131. The substrate 131 includes the etch-resist solution 133a made of the materials having the composition described in TABLE 1. The first alignment is performed while the etch-resist solution 133a is not in contact with the soft mold 134. The alignment mark on the substrate 131 and the alignment mark of the soft mold 134 are created in the first alignment. The alignment mark on the substrate 131 is made in correspondence with the alignment mark on the soft mold 134. At this moment, the deviation of about 50 μm is generated.

Figure 4B:
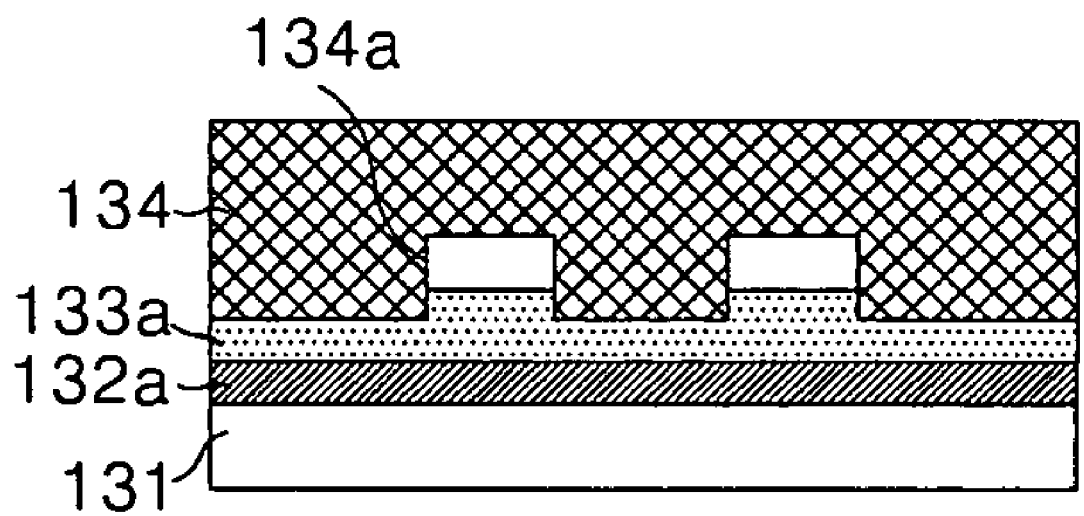

Next, as shown in FIG. 4B, the soft mold 134 is brought to contact with the etch-resist solution 133a. The groove 134a and the projected surface 134b of the soft mold 134 are surface-treated to be hydrophobic, and the etch-resist solution 133a also has the hydrophobic property, thus no repulsive force is generated between the soft mold 134 and the etch-resist solution 133a. This prevents the etch-resist solution 133a from moving into the groove 134a. At this moment, the soft mold 134 is placed over the etch-resist solution 133a on the substrate 131. Accordingly, the soft mold 134 is kept in a "non-bending" state. Thus, the location of the soft mold 134 on the etch-resist solution 133a can be controlled to make the alignment mark on the substrate 131 to perform a second alignment.

Figure 4C:
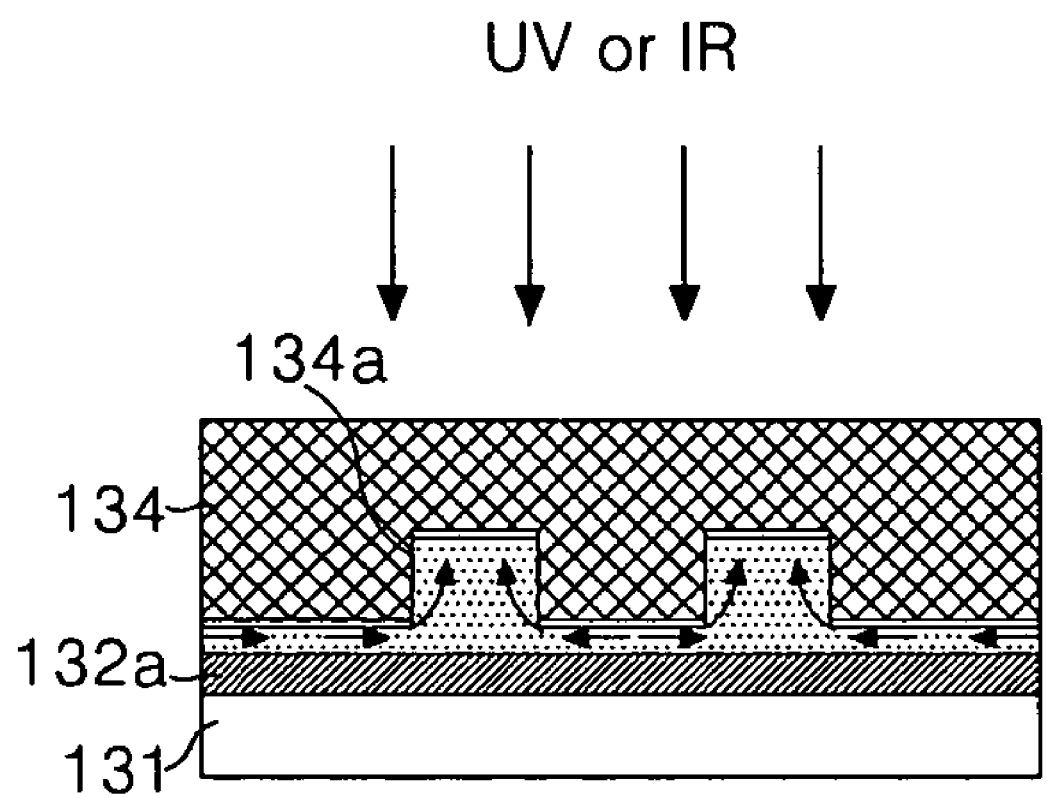
Figure 4D:
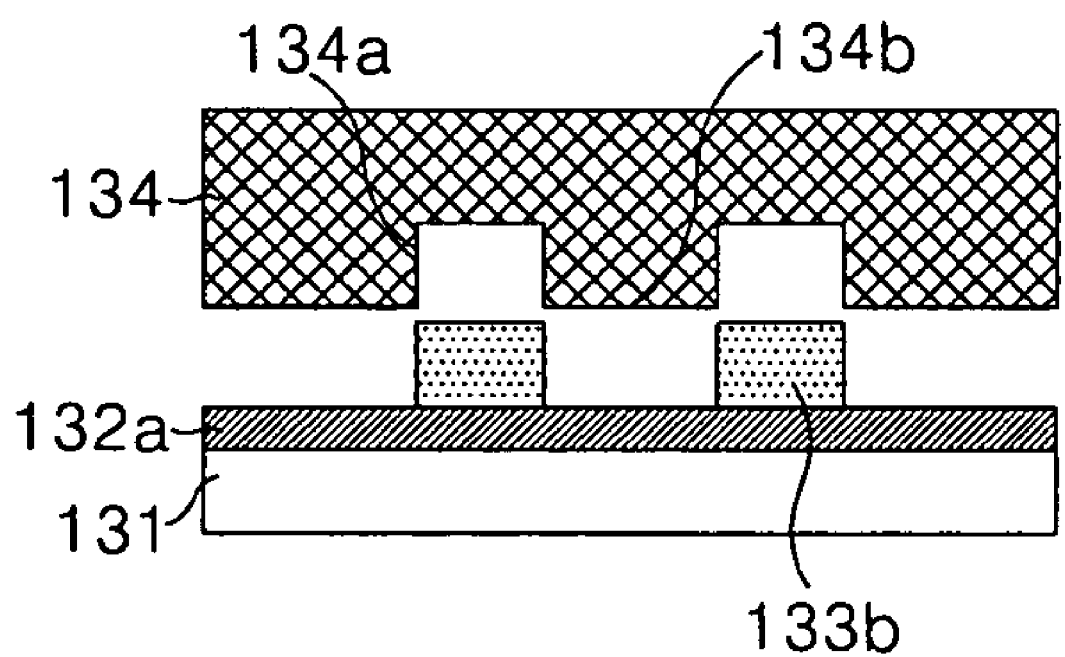
Figure 4E:
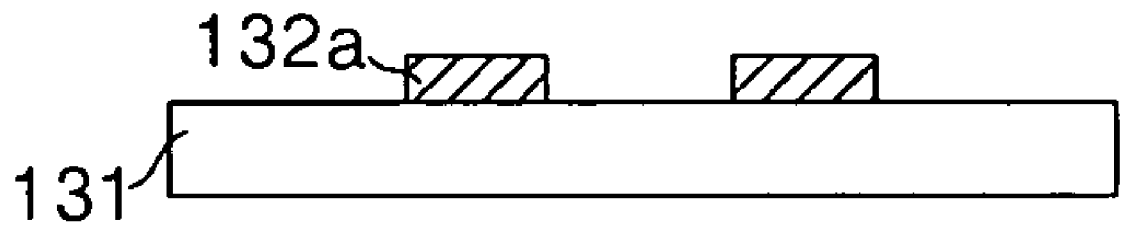

Next, as shown in FIG. 4C, at least one of UV ray and infrared IR is irradiated to the etch-resist solution 133a, so that the activator included in the etch-resist solution 133a starts reacting. As a result, the etch-resist solution 133a is changed from hydrophobic to hydrophilic, and the etch-resist solution 133a moves into the groove 134a by the repulsive force between the soft mold 134 and the etch-resist solution 133a. Thereafter, the etch-resist solution 133a is cured to form the etch-resist pattern 133b.

Figure 5:
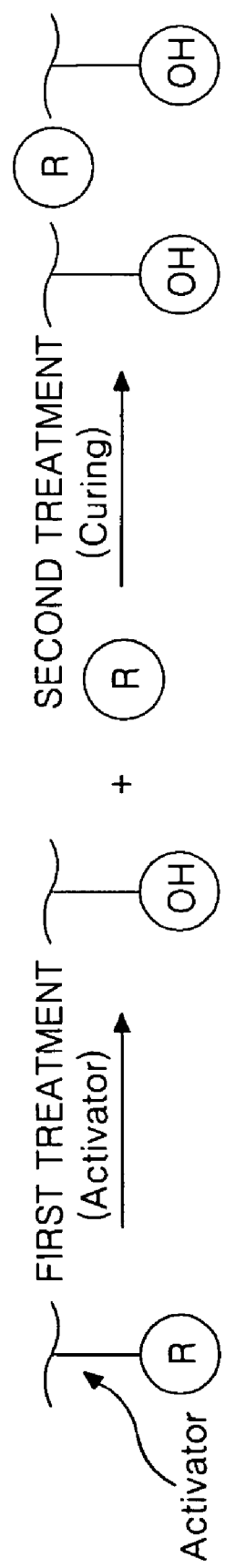
FIG. 5 is a conceptual diagram explaining how the etch-resist changes its molecular structure when light is irradiated.

FIG. 5, describes the process of FIG. 4C. First, the UV or IR having a designated wavelength is irradiated to the activator, thus the activator makes —R radical which is separated from the main resin. Then, —OH radical is combined with the main resin. (first treatment). Accordingly, the etch-resist solution 133a is changed from hydrophobic to hydrophilic. For the reaction of the activator, the UV or IR energy having a wavelength range of about 250 nm or less is used.

The etch-resist solution 133a is cured by the UV or IR having an independent wavelength range which is different from the wavelength used in the reaction of the activator. A wavelength having a range of 300 nm~450 nm is used to cure the etch-resist solution 133a; the —R radical separated from the main resin by the activator is re-combined (second treatment). As a result, the etch-resist pattern 133b shaped by the groove 134a is formed on the thin film 132a of FIG. 4D.

Next, the thin film pattern 132a is formed by the etching process using the etch-resist pattern 133b as a mask. In this way, the fabricating method of the flat panel display according to the exemplary embodiment of the present invention forms a thin film pattern by the soft mold and the etch resist without using the photo process, thereby simplifying the fabricating process. Furthermore, using the etch-resist adapted to change its polarity by application of light, and having the etch-resist in direct contact with the soft mold, accurate alignment can be achieved. Accordingly, the thin film can be formed at the desired position.

The fabricating method of the flat panel display according to the exemplary embodiment of the present invention can be applied to a process for patterning the electrode layer, the organic layer and the inorganic layer of the flat panel display devices such as the liquid crystal display LCD, the field emission display FED, the plasma display panel PDP and the electro-luminescence EL.

It will be apparent to those skilled in the art that various modifications and variations can be made in the method and apparatus for fabricating flat panel display of the present invention without departing from the spirit or scope of the invention. Thus, it is intended that the present invention cover the modifications and variations of this invention provided they come within the scope of the appended claims and their equivalents.

What is claimed is:

1. A fabricating method of a flat panel display, comprising the steps of:
   spreading an etch-resist on a thin film formed on a substrate, a polarity of the etch-resist being changed by irradiation with a first light;
   providing a soft mold having a projected surface and a groove at an upper surface side of the etch-resist at a designated distance from the substrate, the soft mold being surface treated to be the same polarity as the etch-resist;
   performing a first alignment of the soft mold and the substrate;
   performing a second alignment of the soft mold and the substrate;
   changing the polarity of the etch-resist by irradiation with the first light such that the etch-resist moves into a groove of the soft mold;
   forming an etch-resist pattern on the thin film by irradiating a second light onto the etch-resist in the groove;
   separating the soft mold from the etch-resist pattern; and
   forming a thin film pattern by etching a portion of the thin film and the etch-resist pattern.

2. The fabricating method according to claim 1, wherein the etch-resist includes an activator of about 0.01~3%, an initiator of about 0.01~3%, a derivative of about 30~50% and a resin of about 30~50%.

3. The fabricating method according to claim 2, wherein the resin is at least one of liquid monomer and liquid high polymer precursor having tBOC-p-S (para-tert-butoxycarbonyloxystyrene), the activator including a triphenylsulfonium salts material, and the initiator includes 1-hydroxy-cyclohexyl-phenyl-ketone.

4. The fabricating method according to claim 1, wherein the first and second lights have wavelengths that are different ranges from each other.

5. The fabricating method according to claim 2, wherein the activator reacts to the first light and changes the polarity of the etch-resist from hydrophobic to hydrophilic.

6. The fabricating method according to claim 2, wherein the initiator reacts to the second light and cures the etch-resist.

7. The fabricating method according to claim 1, wherein the step of performing the first alignment includes making an alignment mark on one side of the soft mold and making alignment mark on the substrate at corresponding location, and the step of performing the second alignment includes placing the soft mold on the substrate using the alignment mark on one side of the soft mold and the corresponding alignment mark on the substrate so that the soft mold and the substrate contact each other at a desired location.

8. The fabricating method according to claim 1, wherein the flat panel display is any one of a liquid crystal display LCD, a field emission display FED, a plasma display panel PDP, an electro luminescence EL.

9. A fabricating apparatus of a flat panel display, comprising:
   means for spreading an etch-resist on a thin film on a substrate;
   means for performing irradiation of a first light to the etch-resist such that a polarity of the etch-resist changes;
   a soft mold having a projected surface and a groove, the soft mold facing an upper surface of the etch-resist, wherein a surface of the soft mold is treated to be the same polarity as the etch-resist;
   means for performing a first alignment of the soft mold and the substrate, wherein the soft mold and the substrate are separated with a designated distance therebetween;
   means for performing a second alignment of the soft mold and the substrate after placing the soft mold on the etch-resist;
   means for irradiating a second light to the etch-resist;
   means for separating the soft mold from the etch-resist pattern; and
   means for forming a thin film pattern by etching a portion of the thin film, wherein the etch-resist pattern is used as a mask.

10. The fabricating apparatus according to claim 9, wherein the etch-resist includes an activator of about 0.01~3%, an initiator of about 0.01~3%, a derivative of about 30~50% and a resin of about 30~50%.

11. The fabricating apparatus according to claim 10, wherein the resin is at least one of liquid monomer and liquid high polymer precursor having tBOC-p-S (para-tert-butoxycarbonyloxystyrene), the activator including a triphenylsulfonium salts material, and the initiator includes 1-hydroxy-cyclohexyl-phenyl-ketone.

* * * * *